United States Patent [19]

Takikawa

[11] Patent Number: 5,302,840

[45] Date of Patent: Apr. 12, 1994

[54] HEMT TYPE SEMICONDUCTOR DEVICE HAVING TWO SEMICONDUCTOR WELL LAYERS

[75] Inventor: Masahiko Takikawa, Kawasaki, Japan

[73] Assignee: Fujitsu Limited, Kawasaki, Japan

[21] Appl. No.: 899,699

[22] Filed: Jun. 17, 1992

[30] Foreign Application Priority Data

Jun. 20, 1991 [JP] Japan .................. 3-147741

[51] Int. Cl.⁵ .................. H01L 29/161; H01L 29/205; H01L 29/225
[52] U.S. Cl. .................. 257/194; 257/11; 257/20; 257/24; 257/27; 257/192; 257/615; 257/631; 257/914
[58] Field of Search .................. 257/11, 20, 24, 27, 257/189, 192, 194, 195, 200, 201, 613, 615, 616, 631, 914, 12, 13, 14, 15, 17, 18, 19, 20, 23, 26, 28, 29

[56] References Cited

U.S. PATENT DOCUMENTS

| | | | |
|---|---|---|---|
| 4,236,165 | 11/1980 | Kawashima et al. | 257/192 |
| 4,807,001 | 2/1989 | Hida | 257/192 |
| 4,942,438 | 7/1990 | Miyamoto | 257/192 |
| 5,049,951 | 9/1991 | Goronkin et al. | 257/192 |
| 5,060,031 | 10/1991 | Abrokwah et al. | 257/192 |

FOREIGN PATENT DOCUMENTS

| | | |
|---|---|---|
| 0067721 | 12/1982 | European Pat. Off. . |
| 0167814 | 1/1986 | European Pat. Off. . |
| 0256363 | 2/1988 | European Pat. Off. . |
| 0323896 | 7/1989 | European Pat. Off. . |
| 0397148 | 11/1990 | European Pat. Off. . |
| 3731000 | 3/1989 | Fed. Rep. of Germany . |
| 57-208174 | 12/1982 | Japan . |
| 263472 | 12/1985 | Japan . |
| 274369 | 12/1986 | Japan . |
| 136081 | 6/1987 | Japan . |
| 1-183859 | 7/1989 | Japan . |
| 256175 | 10/1989 | Japan . |

OTHER PUBLICATIONS

Akinwande et al., "Complementary III–V Heterostructure FETs for Low Power Integrated Circuits", IEEE 1990 (IEDM90), pp. 983–986.
Daniels et al., "Complementary Hetrostructure Insulated Gate FET Circuits for High-Speed, Low Power VLSI", IEEE 1986 (IEDM86), pp. 448–451.
WO-A-8 901 704, Published Feb. 23, 1989; (Regents of the University of Minnesota) *p. 14, lines 9–24; FIGS. 12A, 12B*.

Primary Examiner—Andrew J. James
Assistant Examiner—Alice W. Tang
Attorney, Agent, or Firm—Staas & Halsey

[57] ABSTRACT

A HEMT type semiconductor device includes a semiconductor substrate, a buffer semiconductor layer formed on the substrate, a first semiconductor well layer formed on the buffer layer and serving as a first conductivity type channel layer, a second semiconductor well layer formed on the first well layer and serving as a second conductivity type opposite the first conductivity, a channel layer and a potential barrier layer formed on the second well layer and forming a potential barrier for carriers. The substrate is made of GaAs or InP, and the layers are successively and epitaxially grown on the substrate. A two dimensional hole gas and a two dimensional electron gas are confined in the first well layer and in the second well layer, respectively.

10 Claims, 10 Drawing Sheets

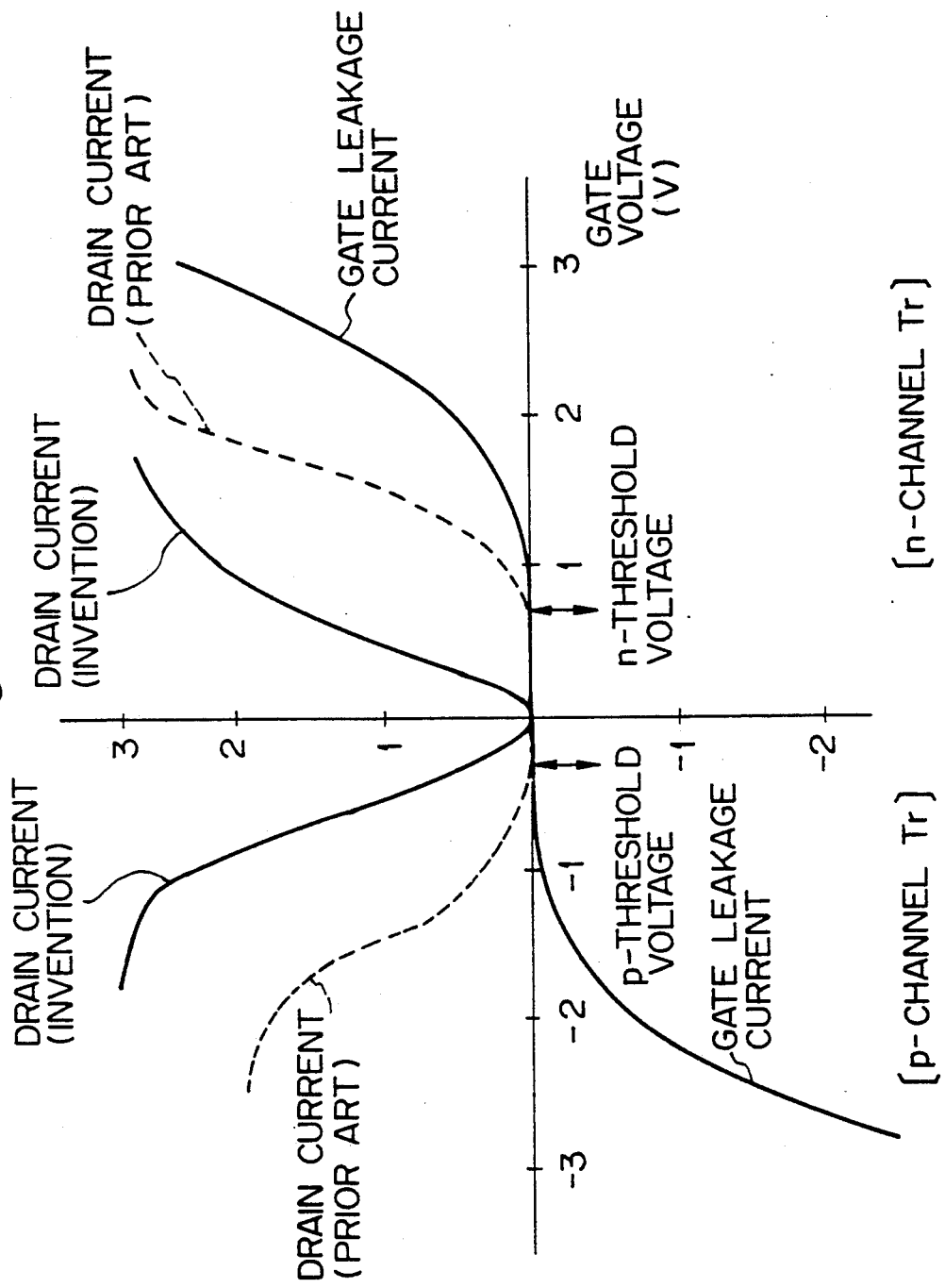

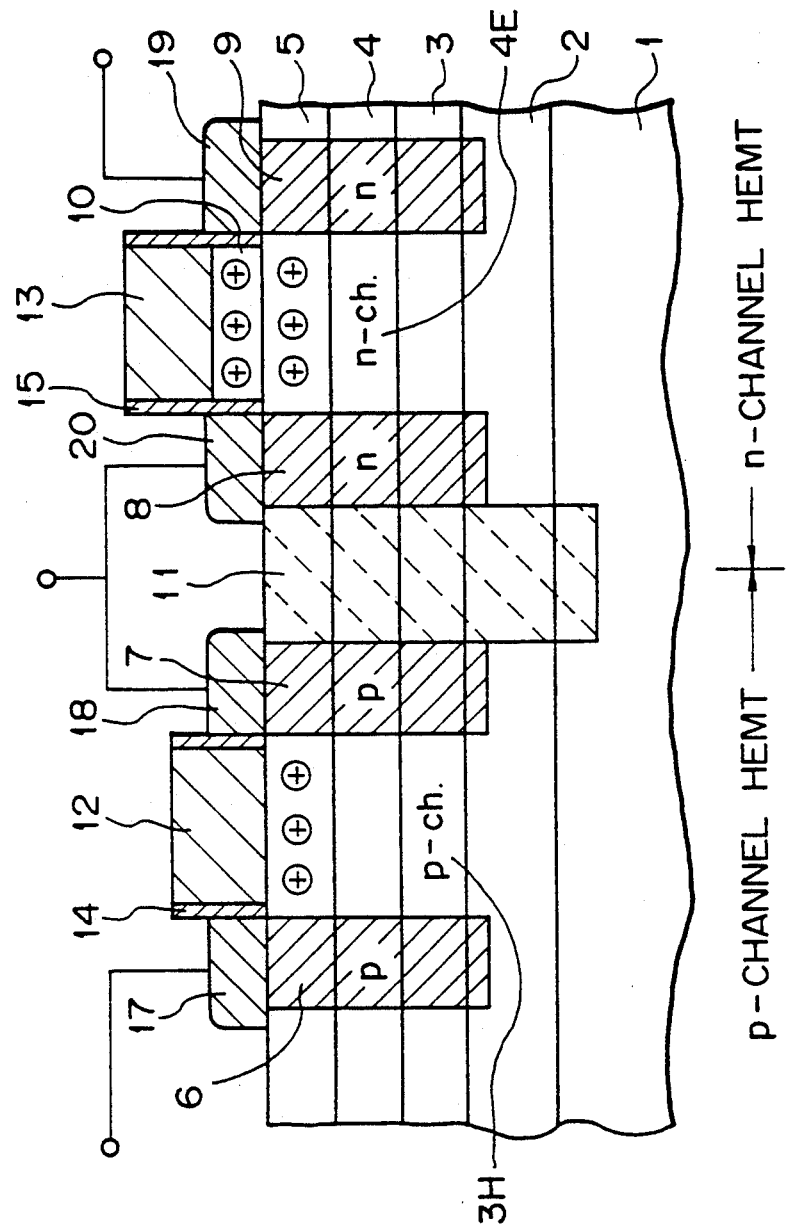

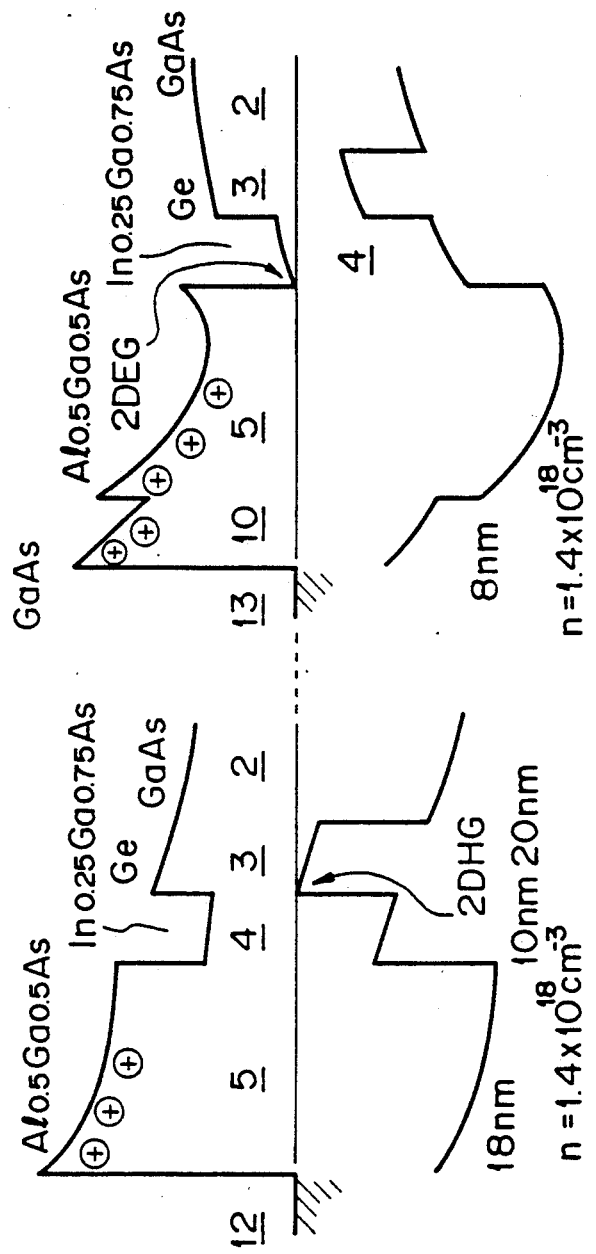

HEMT TYPE SEMICONDUCTOR DEVICE HAVING TWO SEMICONDUCTOR WELL LAYERS

BACKGROUND OF THE INVENTION

1. Field of the Invention

The present invention relates to a semiconductor device, and more particularly, to a HEMT (High Electron Mobility Transistor) type semiconductor device.

2. Description of the Related Art

A conventional HEMT type semiconductor device comprises a semiconductor substrate, a buffer layer formed on the substrate, a semiconductor well layer (i.e., a channel layer or a carrier-flowing layer) formed on the buffer layer, a potential barrier layer forming an electric potential barrier against the carriers and formed on the well layer, and a gate electrode forming a Schottky contact and formed on the barrier layer. In the semiconductor well layer electrons (so-called two dimensional electron gas) are generated and flow at a high electron mobility, or holes (so-called two dimensional hole gas) are generated and flow at a high hole mobility. The substrate and formed layers are made of suitable compound semiconductor materials and form heterojunctions at the interfaces between them. For example, the substrate and the well layer (channel layer) are of GaAs, InGaAs or InP, and the barrier layer is of AlGaAs or AlInAs.

Referring to FIG. 1, a conventional complementary HEMT type semiconductor device (C-HEMT) comprises, for example, a semiconductor substrate 51 of a semi-insulating GaAs substrate, a buffer layer 52 of undoped GaAs layer, a semiconductor well layer 53 of undoped In$_{0.25}$Ga$_{0.5}$As layer, and a potential barrier layer 55 of Al$_{0.5}$Ga$_{0.75}$As, the layers being formed by a continuous epitaxial growth process. To separate a p-channel HEMT and an n-channel HEMT from each other, an isolation region 61 is formed by ion-implanting B (boron) or O (oxygen) ions to the substrate 51 from the top surface of the potential barrier layer 55. On the barrier layer 55 first and second gate electrodes 62 and 63 are formed as Schottky barrier contacts and are surrounded by side-wall insulating films 64 and 65 of, e.g., SiO$_2$, respectively. P-type (electrode) regions 56 and 57 are formed by selectively ion-implanting p-type impurities (e.g., Be) to the buffer layer 52 from the top surface of the potential barrier layer 55 by using the first gate electrode 62 and a suitable resist pattern layer (not shown) as a mask, and n-type (electrode) regions 58 and 59 are formed by selective ion-implanting n-type impurities (e.g, Si) in the layers 52, 53 and 55 by using the second gate electrode 63 and another suitable resist pattern layer as another mask. On the doped regions 56 and 57 p-type electrodes (not shown) are formed, on the doped regions 58 and 59 n-type electrode (not shown) are formed, and then these electrodes are electrically connected with suitable interconnections (e.g., wiring layers, not shown) to form an electric circuit.

In such a C-HEMT, a p-channel (i.e., two dimensional hole gas) is generated in a p-channel region 53p of a portion of the semiconductor well layer 53 between the p-type regions 56 and 57 and an n-channel (i.e., two dimensional electron gas) is generated in an n-channel region 53n of another portion of the semiconductor well layer 53 between the n-type regions 58 and 59.

A C-HEMT having the above-mentioned structure corresponds to a complementary III-V heterostructure FET (C-HFET) disclosed in an article by A. I. Akinwande et al. IEDM90, IEEE, 1990, pp. 983–986. The article discloses that a p-channel HFET (i.e., p-channel HEMT) has a threshold voltage of about −0.350 V (see Table 2) and an n-channel HFET (i.e., n-channel HEMT) has a threshold voltage of about 0.716 V (see Table 1). The sum (1.066 V) of the threshold voltages of the p-channel HEMT and n-channel HEMT corresponds to a bandgap of the semiconductor well layer 53. A drain current variation of each of the p-channel HEMT and n-channel HEMT, depending on the gate turn-on voltage, is obtained, as shown with a broken line in FIG. 2.

The conventional C-HEMT shown in FIG. 1 has, however, relatively high threshold voltages, and when absolute values of gate voltages applied on the gate electrodes are increased, gate leakage currents between the gate and source are generated and increased, as shown in FIG. 2. In such a case, when a logic amplitude is increased to maintain a high speed operation, the gate leakage current is also increased. Where the gate leakage current is suppressed, a gate voltage cannot be increased with the result that the high speed operation is not sufficiently attained. For example, at a power supply voltage of 1.5 V, a no-load gate delay is about 230 ps and power dissipation is about 64 μW/gate, and at a power voltage of 1.0 V, a no-load gate delay is about 700 ps and power dissipation is about 7 μW/gate (cf. the above-cited article, page 985, right column).

It is possible to adjust the threshold voltage of the n-HEMT to about zero volt by adding a threshold voltage controlling layer formed between the potential barrier layer and the gate electrode of the n-HEMT. In this case, it is necessary to make the controlling layer relatively thick, and thus a distance between the gate electrode and the semiconductor well layer becomes large, which deteriorates the controllability of the n-HEMT.

Another C-HEMT similar to that of FIG. 1 has been reported by R. R. Daniels et al. "Complementary Heterostructure Insulated Gate FET Circuits for High-Speed, Low Power VLSI", IEDM86, IEEE, 1986, pp. 448–451.

To lower the threshold voltages of the p-channel HEMT and n-channel HEMT, it is possible to form these HEMTs on the same semiconductor substrate such that a semiconductor laminated structure of the former HEMT is different from that of the latter HEMT. For example, Japanese Unexamined Patent Publication (Kokai) No. 57-208174 proposed a complementary FET utilizing a two dimensional electron gas and two dimensional hole gas; the FET of which comprises a p-channel HEMT having an undoped Ge layer, an undoped GaAs layer and a p-GaAs layer successively epitaxially grown on an undoped GaAlAs layer formed on a semi-insulating GaAs substrate; and an n-channel HEMT having an undoped GaAs layer, an undoped GaAlAs layer and an n-GaAlAs layer successively epitaxially grown on the undoped GaAlAs layer on the substrate, as shown in FIG. 9 thereof.

SUMMARY OF THE INVENTION

An object of the present invention is to provide a new structure HEMT type semiconductor device having a p-channel layer for a two dimensional hole gas and an n-channel layer for a two dimensional electron gas, the p-channel layer being different from the n-channel layer.

Another object of the present invention is to provide a new structure C-HEMT comprising a p-channel HEMT and an n-channel HEMT having low threshold voltages.

Further another object of the present invention is to provide a HEMT type semiconductor device operating a p-channel HEMT or an n-channel HEMT in a device structure having a gate electrode and two electrodes arranged on both sides of the gate electrode.

The above-mentioned and other objects of the present invention are attained by providing a HEMT type semiconductor device comprising:

a semiconductor substrate;

a buffer semiconductor layer formed on the substrate;

a first semiconductor well layer formed on the buffer layer and serving as a first conductivity type channel layer;

a second semiconductor well layer formed on the first well layer and serving as a second conductivity type opposite the first conductivity, channel layer; and a potential barrier layer formed on the second well layer and forming a potential barrier for carriers.

The first well layer is used for generating one of a two dimensional hole gas of a p-channel and a two dimensional electron gas of an n-channel, and the second well layer is used for generating the other.

According to the present invention, since the first semiconductor well layer and the second semiconductor well layer are successively piled on the buffer semiconductor layer, semiconductor materials of the first and second well layers are independently selected to lower the threshold voltages of a p-channel HEMT and an n-channel HEMT.

Preferably, a complementary HEMT type semiconductor device comprising:

a semiconductor substrate;

a buffer semiconductor layer formed on the substrate;

a first semiconductor well layer formed on the buffer layer and serving as a first conductivity type channel layer;

a second semiconductor well layer formed on the first well layer and serving as a second conductivity type opposite the first conductivity, channel layer; and a potential barrier layer formed on the second well layer and forming a potential barrier for carriers;

an isolation region extending from the potential barrier layer to the semiconductor substrate for a p-channel HEMT area and an n-type channel HEMT area;

p-type regions extending from the potential barrier layer to the buffer layer within the p-channel HEMT area;

a gate electrode formed on the potential barrier layer and located between the p-type regions;

n-type regions extending from the potential barrier layer to the buffer layer within the n-channel HEMT area;

a threshold voltage controlling semiconductor layer selectively formed on the potential barrier layer between the n-type regions; and a gate electrode on the threshold voltage controlling layer.

It is possible to use semiconductor materials as follows; the substrate is GaAs, one of the first well layer and second well layer is one of Ge and GaAsSb, the other InGaAs, the potential barrier layer is one of AlGaAs and AlInGaP, and the threshold voltage controlling layer is GaAs. Furthermore, where the substrate is made InP, one of the first well layer and second well layer is GaAsSb, the other is InGaAs, the potential barrier layer is one of AlInAs, AlGaAs, and AlGaAsSb, and the threshold voltage controlling layer is InP.

According to the present invention, since the p-HEMT and n-HEMT use the same substrate, buffer layer, first and second well layers, and potential barrier layer, easier production of the C-HEMT is possible.

Preferably, a HEMT type semiconductor device having a special operation comprises:

a semiconductor substrate;

a buffer semiconductor layer formed on the substrate;

a first semiconductor well layer formed on the buffer layer and serving as a first conductivity type channel layer;

a second semiconductor well layer formed on the first well layer and serving as a second conductivity type opposite the first conductivity, channel layer; and a potential barrier layer formed on the second well layer and forming a potential barrier for carriers;

a gate electrode formed on the potential barrier layer;

a pair of ohmic electrodes formed on the potential barrier layer and located on both sides of the gate electrode;

p-type regions extending from the potential barrier layer to the buffer layer under the ohmic electrodes, respectively; and n-type regions extending from the potential barrier layer to the buffer layer under the ohmic electrodes, respectively, the p-type regions and n-type regions being adjacent to each other along the longitudinal direction of the ohmic electrode.

In this HEMT type semiconductor device, the device is provided with one gate and two electrodes for one FET, which can operate as a p-channel HEMT or an n-channel HEMT depending on a gate voltage.

BRIEF DESCRIPTION OF THE DRAWINGS

The present invention will be more apparent from the description of the preferred embodiments set forth below the reference to the accompanying drawings, in which;

FIG. 2 is a diagram showing drain currents and gate leakage currents depending on a gate voltage;

FIG. 3 is a schematic sectional view of a C-HEMT according to the first embodiment of the present invention;

FIG. 4B is an energy band diagram of a p-channel HEMT of the C-HEMT using a GaAs substrate;

FIG. 4C is an energy band diagram of an n-channel HEMT of the C-HEMT using a GaAs substrate;

DESCRIPTION OF THE PREFERRED EMBODIMENTS

Figure 1:
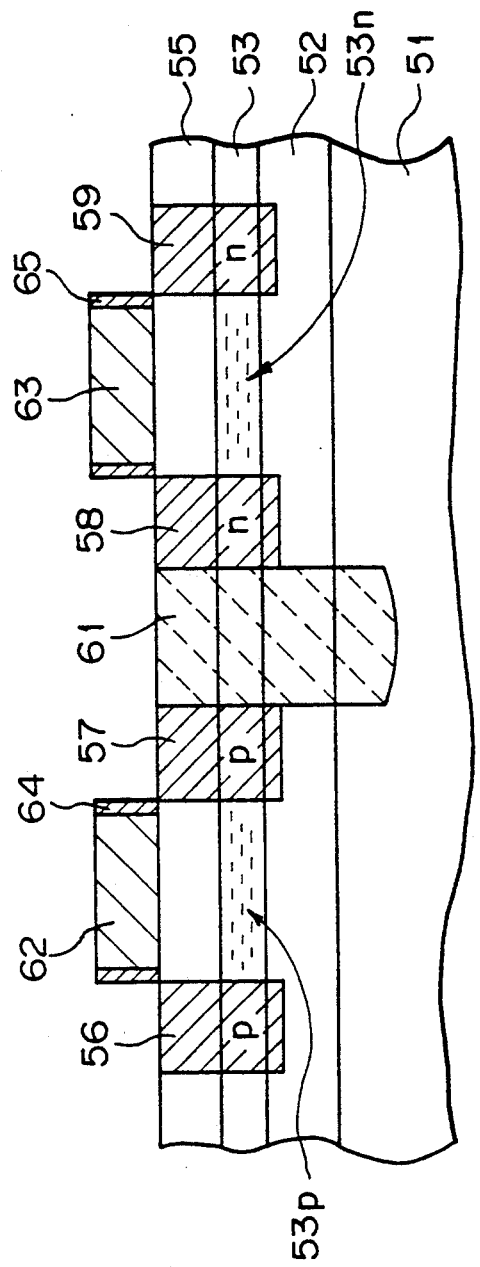
FIG. 1 is a schematic sectional view of a conventional C-HEMT.

Referring to FIG. 3, a complementary HEMT type semiconductor device (C-HEMT) comprises a semiconductor multilayer structure epitaxially formed on a semi-insulating substrate 1; the multilayer structure is composed of a buffer layer 2 for improving crystallinity, a first semiconductor well layer 3 for a p-channel, a second semiconductor well layer 4 for an n-channel, and a potential barrier layer 5 for a potential barrier against carriers. The buffer layer 2 serves as a potential barrier for carriers flowing through channel layers 3 and 4. These layers 2, 3, 4 and 5 are successively formed (deposited) on the substrate 1 by a continuous epitaxial growth method. On the layer 5, a threshold voltage controlling semiconductor layer 10 is epitaxially formed by the continuous epitaxial growth method and then is selectively removed by a suitable etching method.

The semiconductor multilayer structure is separated with an isolation region 11 into a p-channel HEMT area (at a left side) and an n-channel HEMT area (at a right side). In the p-channel HEMT area, a Schottky gate electrode 12 is formed on the potential barrier layer 5 and is surrounded with an insulating layer 14 on its sides, and a p-type source region 6 and a p-type drain region 7 are formed in the multilayer structure to extend to the buffer layer 2 from the potential barrier layer 5. In the n-channel HEMT area, a Schottky gate electrode 13 is formed on the threshold voltage controlling semiconductor layer 10 and they are surrounded with an insulating layer 15 on their sides, and an n-type source region 9 and an n-type drain region 8 are formed in the multilayer, structure to extend to the buffer layer 2 from the potential barrier layer 5.

A source ohmic electrode 17 and a drain ohmic electrode 18 are formed on the p-type regions 6 and 7, respectively, and a source ohmic electrode 19 and an drain ohmic electrode 20 are formed on the n-type regions 9 and 8, respectively. Furthermore, suitable interconnections (conductor lines) are formed to connect the drain electrodes 18 and 20 and to make a suitable circuit. Thus, the C-HEMT is complicated.

As above-mentioned, the second well layer 4 can be made of a semiconductor material different from that of the first well layer 3 for the p-channel; suitable semiconductor materials are selected for the first and second well layers to lower both the threshold voltages of the p-channel HEMT and n-channel HEMT. Furthermore, where the potential barrier layer 5 is doped with impurities to retain ionized charges (i.e., impurities) after an outflow of free carriers, the ionized charge contributes an adjustment of potentials of the semiconductor well layers. When the layer 5 is doped with n-type impurities, positive ionized charges remain to shift the threshold voltage of both the p-channel and n-channel HEMTs toward negative.

For the n-channel HEMT it is preferable to dope the threshold controlling layer 10 with n-type impurities with the result that positive ionized charges remain to shift the threshold voltage of the n-channel HEMT toward negative.

Figure 10:
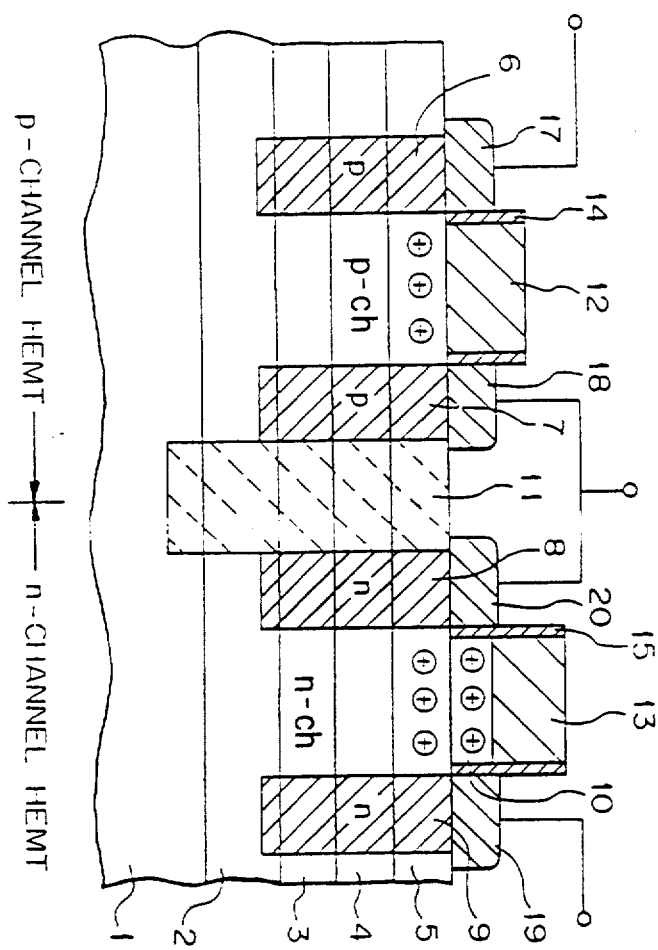
FIG. 10 is a schematic sectional view of a C-HEMT according to a modification of the first embodiment of FIG. 3.

It is possible to reverse the piling order of the semiconductor well layer for the p-channel layer and the semiconductor well layer for the n-channel layer, namely, the former layer for the p-channel layer is formed on the latter layer for the n-channel layer (see FIG. 10). However, where the n-channel semiconductor well layer lies under the p-channel well layer, a distance between the Schottky gate electrode 13 and the n-channel layer 3 becomes larger, which reduces the controllability of the n-HEMT. Furthermore, it is preferable that the distance between the p-channel semiconductor well layer and its gate electrode is almost equal to that between the n-channel semiconductor well layer and its gate electrode, since such a condition is suitable for operation uniformity of these HEMTs. Therefore, it is preferable to form the n-channel semiconductor well layer on the p-channel semiconductor well layer.

EXAMPLE 1

Figure 4A:
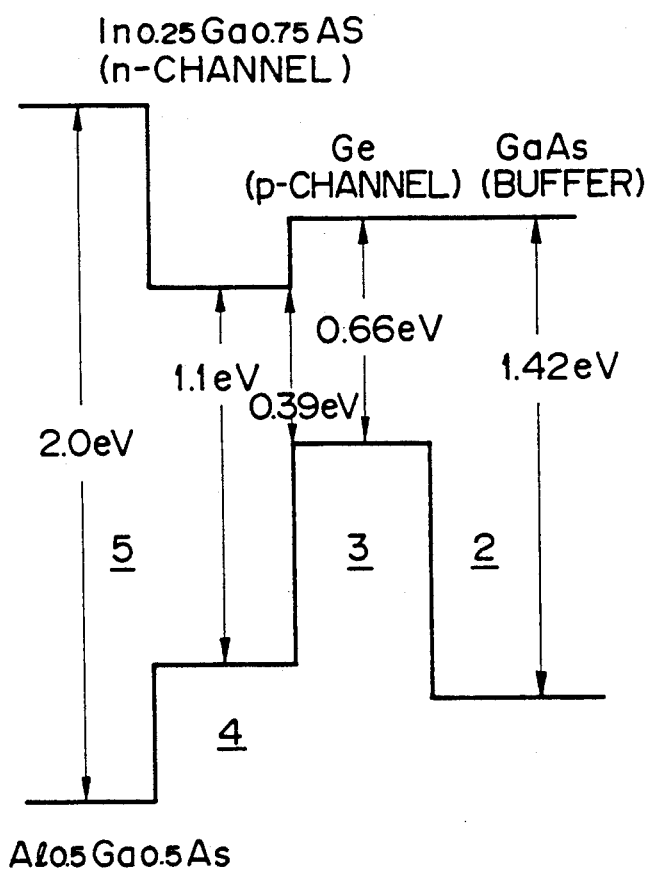
FIG. 4A is an energy band diagram of a semiconductor multilayer structure of a C-HEMT using a GaAs substrate.

A C-HEMT according to the first embodiment of the present invention comprises a semi-insulating GaAs substrate 1, the semiconductor multilayer structure shown in FIG. 4A, and an n-type GaAs threshold voltage controlling layer 10, as shown in FIG. 3. The buffer layer 2 is made of undoped GaAs having a bandgap of about 1.42 eV; the p-channel semiconductor well layer 3 is made of undoped Ge having a bandgap of about 0.66 eV; the n-channel semiconductor well layer 4 is made of undoped $In_{0.25}Ga_{0.75}As$ having a bandgap of about 1.1 eV, and the potential barrier layer 5 is made of n-type $Al_{0.5}Ga_{0.5}As$ having a bandgap of about 2.0 eV. In this case, conduction band bottoms and valence band tops of the semiconductor layers 2 to 5 make a band diagram as shown in FIG. 4A, and thus the potential difference between the valence band top of the p-channel layer 3 and the conduction band bottom of the n-channel layer 4 is about 0.39 eV. This value is much smaller than "about 1.0 eV" of the conventional C-HEMT shown in FIGS. 1 and 2 which comprises a single semiconductor well layer for both the p-channel and n-channel HEMTs.

Furthermore, the threshold voltages of both the p-HEMT and the n-HEMT can be lowered to nearly zero in the following manner.

The GaAs buffer layer 2 having a thickness of, e.g., about 600 nm, is epitaxially formed on the semi-insulating GaAs substrate 1; the undoped Ge layer 3 having a thickness of, e.g., about 20 nm, is epitaxially formed on the buffer layer 2, and then the undoped $In_{0.25}Ga_{0.75}As$ layer 4 has a thickness of about 10 nm. The n-type $Al_{0.5}Ga_{0.5}As$ layer 5 having a thickness of, e.g., 18 nm and doped with n-type impurities (Si) of about $1.4 \times 10^{18}$ $cm^{-3}$, is epitaxially formed on the layer 4.

In the p-channel HEMT, the Schottky gate electrode 12 is directly formed on the potential barrier layer 5, and thus a band diagram shown in FIG. 4B is obtained. The doped impurities (Si) in the layer 5 are ionized to generate positive stationary charges, which raises the valence band top of the p-channel semiconductor well layer 3 to a level almost equal to the Fermi level. Accordingly, the threshold voltage of the p-channel layer 3 becomes almost zero. A two dimensional hole gas (2DHG; hole carriers) is generated in a portion 3H of the p-channel layer 3 between the p-type regions 6 and 7.

In the n-channel HEMT, the n-type GaAs layer 10 having a thickness of, e.g., 8 nm and doped with n-type impurities Si) of about $1.4 \times 10^{-18}$ cm$^{-3}$, is epitaxially formed on the potential barrier layer 5. The Schottky gate electrode 13 is directly formed on the controlling layer 10, and thus a band diagram as shown in FIG. 4C is obtained. The doped impurities (Si) in the layer 10 are also ionized to generate positive stationary charges, which lower the conduction band bottom of the n-channel semiconductor well layer 4 to a level almost equal to the Fermi level. Accordingly, the threshold voltage of the n-channel layer 4 becomes almost zero. A two dimensional electron gas (2DEG; electron carriers) is generated in a portion 4E of the n-channel layer 4 between the n-type regions 8 and 9.

Therefore, the C-HEMT consisting of the p-channel HEMT and n-channel HEMT having zero threshold voltages and drain current curves, indicated with solid lines in FIG. 2, can be obtained.

Where a semiconductor layer having a different composition from that of a semiconductor substrate is epitaxially grown on the semiconductor substrate, it is necessary to consider lattice matching. When a lattice constant of the epitaxial layer is different from that of the substrate, a thickness of the epitaxial layer is limited so as to prevent misfit dislocations from occurring. In such a case, the epitaxial layer has a strain therein.

The C-HEMT shown in FIGS. 3 and 4A to 4C is produced as follows, for example.

The semi-insulating GaAs substrate (wafer) is set in a metal organic chemical vapor deposition (MOCVD) apparatus to successively and epitaxially grow the undoped GaAs buffer layer 2 (about 600 nm thick), the p-channel undoped Ge layer 3 (about 20 nm thick), the n-channel undoped $In_{0.25}Ga_{0.75}As$ layer (about 10 nm thick), the n-type $Al_{0.5}Ga_{0.5}As$ layer 5 (about 18 nm thick), and the n-type GaAs layer 10 (8 nm thick), on the substrate. Each of the n-type layers 5 and 10 is doped with Si ions of about $1.4 \times 10^{-18}$ cm$^{-3}$. Then B ions are selectively ion-implanted to reach the substrate 1 at an acceleration energy of about 140 keV and a dose of about $4 \times 10^{-13}$ cm$^{-2}$, so that the isolating region 11 is formed into separate the semiconductor multilayer structure into the p-channel HEMT area and the n-channel HEMT. By using a photomask and a suitable etching process, the n-type GaAs layer 10 is selectively dry-etched to leave a portion thereof as the threshold voltage controlling layer on the layer 5 at the n-channel HEMT area.

Next, a WSi layer is deposited over the layers 5 and 10 by a sputtering process and is selectively etched by using conventional photolithography to form the Schottky gate electrodes 12 and 13 having a gate length of about 1 μm. A SiO$_2$ layer is deposited over the whole surface by a CVD process and is anisotropically etched to leave insulating layers 14 and 15 on sidewalls of the gate electrode 12 and of the gate electrode 13 and layer 10, respectively. Then, Be ions are selectively ion-implanted at an acceleration energy of about 40 keV and a dose of about $1.4 \times 10^{-13}$ cm$^{-2}$ by using the gate electrode 12 and a suitable resist pattern as a mask, and Si ions are selectively ion-implanted at an acceleration energy of about 40 keV and a dose of about $1.4 \times 10^{-13}$ cm$^{-2}$ by using the gate electrode 13 and another suitable resist pattern as a mask. Thereafter, a rapid thermal annealing is carried out to form the p-type regions 6 and 7 and the n-type regions 8 and 9, which extend to the buffer layer 2, as shown in FIG. 3.

Then, an AuGe/Ni/Au layer is deposited and patterned by a vacuum evaporation method and a lift-off process to form the electrodes 19 and 20 on the n-type regions 9 and 8, and an AuZn/Au layer is deposited and patterned by a vacuum evaporation method and a lift-off process to form the electrodes 17 and 18 on the p-type 6 and 7, respectively. An annealing treatment is carried out at about 400° C., for 5 minutes, under a nitrogen atmosphere to complete the ohmic electrodes 17, 18, 19 and 20.

Finally, suitable interconnections (conductive lines) of, e.g., aluminum or its alloy, are formed to make a complementary circuit (C-HEMT) including the p-channel HEMT and n-channel HEMT interconnected to each other.

EXAMPLE 2

Figure 5:
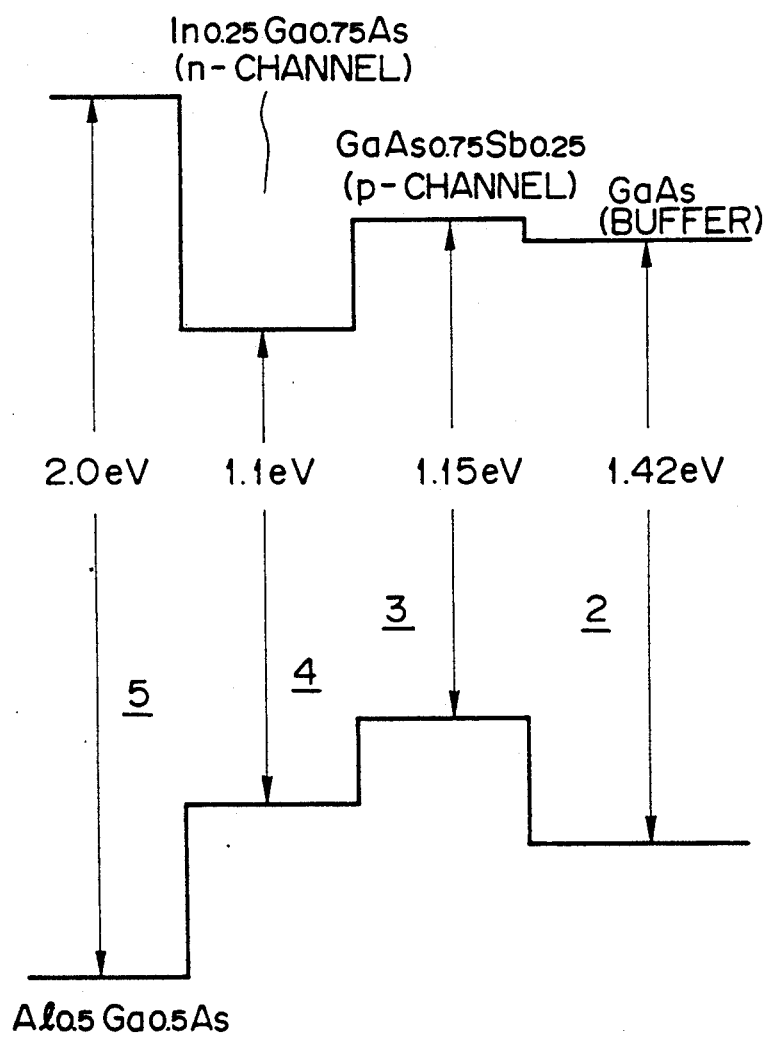
FIG. 5 is an energy band diagram of another semiconductor multilayer structure of a C-HEMT using a GaAs substrate.

On the semi-insulating GaAs substrate 1, another semiconductor multilayer structure shown in FIG. 5 is formed in the same manner as that in Example 1, except for the use of $GaAs_{0.75}Sb_{0.25}$ for the p-channel layer 3 instead of the Ge layer. In this case, the multilayer structure comprises a buffer layer 2 which is made of undoped GaAs having a bandgap of about 1.42 eV and is 600 nm thick, a p-channel semiconductor well layer 3 which is made of undoped $GaAs_{0.75}Sb_{0.25}$ having a bandgap of about 1.15 eV and is 20 nm thick, an n-channel semiconductor well layer 4 which is made of undoped $In_{0.25}Ga_{0.75}As$ having a bandgap of about 1.1 eV and is 10 nm thick, and a potential barrier layer 5 which is made of p-type $Al_{0.5}Ga_{0.5}As$ having a bandgap of about 2.0 eV and is 12 nm thick; layers 2 to 5 are successively and epitaxially formed on the substrate 1. The p-type layer 5 is doped with Be ions of $1.4 \times 10^{18}$ cm$^{-3}$ to lower the threshold voltage of the p-channel HEMT to nearly zero. Furthermore, the threshold voltage controlling layer 10 is made of n-type GaAs and has a thickness of 44 nm, for the n-channel HEMT. The n-type layer 10 is doped with Si ions of about $1.4 \times 10^{18}$ cm$^{-3}$ to lower threshold voltage of the n-channel HEMT to nearly zero.

EXAMPLE 3

Figure 6A:
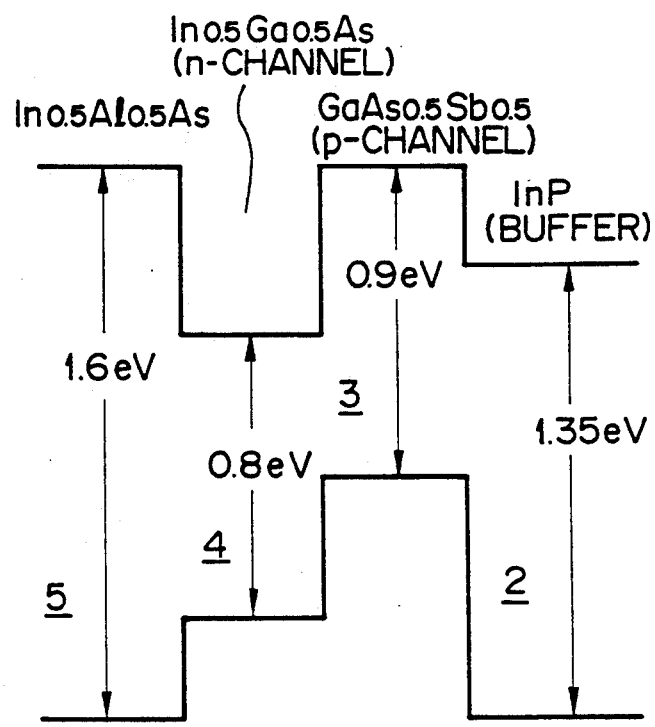
FIG. 6A is an energy band diagram of a semiconductor multilayer structure of a C-HEMT using an InP substrate.
Figure 6B:
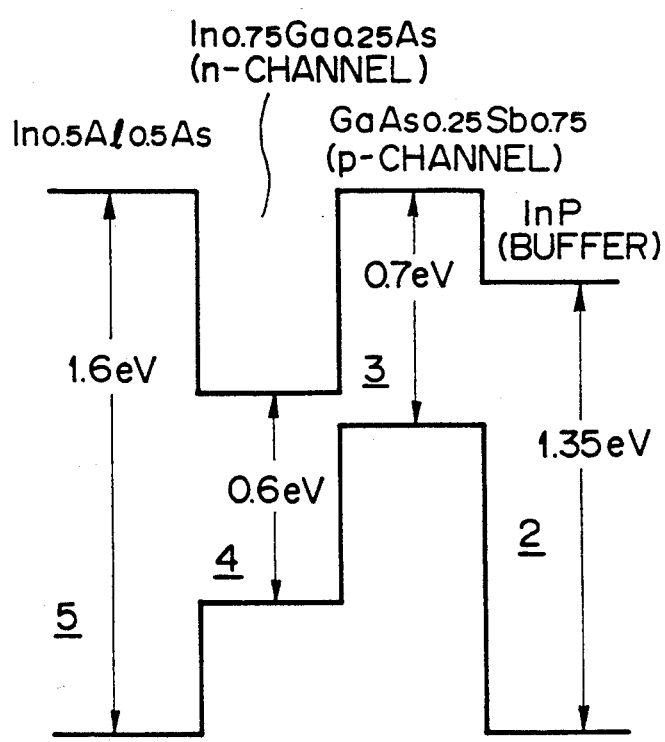
FIG. 6B is an energy band diagram of another semiconductor multilayer structure of a C-HEMT using an InP substrate.

A C-HEMT having a structure shown in FIG. 3 is produced by using an InP substrate 1 instead of the GaAs substrate and by epitaxially growing a semiconductor multilayer structure shown in FIG. 6A or 6B on the substrate 1. The multilayer structure (FIG. 6A) comprises a buffer layer 2 which is made of undoped InP having a bandgap of about 1.35 eV and is 600 nm thick, a p-channel semiconductor well layer 3 which is made of undoped $GaAs_{0.5}Sb_{0.5}$ having a bandgap of about 0.9 eV and is 15 nm thick, an n-channel semiconductor well layer 4 which is made of undoped $In_{0.5}Ga_{0.5}As$ having a bandgap of 0.8 eV and is 15 nm thick, and a potential barrier layer 5 which is made of n-type $In_{0.5}Al_{0.5}As$ having a bandgap of about 1.6 eV and is 17 nm thick. The n-type layer 5 is doped with Si ions of about $1.4 \times 10^{18}$ cm$^{-3}$ to lower the threshold voltage of the p-channel HEMT to nearly zero. Furthermore, the threshold voltage controlling layer 10 made of n-type InP and being 14 nm thick is epitaxially formed on the layer 5 for the n-channel HEMT. The n-type layer 10 is doped with Si ions of about $1.4 \times 10^{18}$ cm$^{-3}$ to lower the threshold voltage of the n-channel HEMT to nearly zero.

As shown in FIG. 6B, the other multilayer structure comprises a buffer layer 2 which is made of undoped InP and is 600 nm thick, a p-channel semiconductor well layer 3 which is made of undoped $GaAs_{0.25}Sb_{0.75}$ having a bandgap of about 0.7 eV and is 10 nm thick, an n-channel semiconductor well layer 4 which is made of undoped $In_{0.75}Ga_{0.25}As$ having a bandgap of 0.6 eV is 10 nm thick, and a potential barrier layer 5 which is made of n-type $In_{0.5}Al_{0.5}As$ and is 20 nm thick. The n-type layer 5 is doped with Si ions of about $1.4 \times 10^{18}$ $cm^{-3}$ to lower the threshold voltage of the p-channel HEMT to nearly zero. Furthermore, the threshold voltage controlling layer 10 made of n-type InP and being 2 nm thick is epitaxially formed on the layer 5 for the n-channel HEMT. The n-type layer 10 is doped with Si ions of about $1.4 \times 10^{18}$ $cm^{-3}$ to lower the threshold voltage of the n-channel HEMT to nearly zero.

As is evident from FIGS. 4A, 5, 6A and 6B, from the viewpoint of the hole energy, the top of the valence band of the p-channel semiconductor well layer 3 is higher than the tops of the valence band of the buffer layer 2 and n-channel semiconductor well layer 4 and potential barrier layer 5, while from the viewpoint of electron energy, the bottom of the conduction band of the n-channel semiconductor well layer 4 is lower than the bottoms of the conduction band of the buffer layer 2, p-channel semiconductor well layer 3 and potential barrier layer 5. Therefore, carriers (holes or electrons) are injected into the semiconductor well layers 3 and 4 to confine the holes in the layer 3 and the electrons in the layer 4, respectively. Moreover, these semiconductor multilayer structures can lower the threshold voltages of both the p-channel and n-channel HEMTs of a conventional C-HEMT. The formation of the threshold voltage controlling layer and the modulation doping for the potential layer and the controlling layer can adjust the threshold voltages to almost zero.

Figure 7:
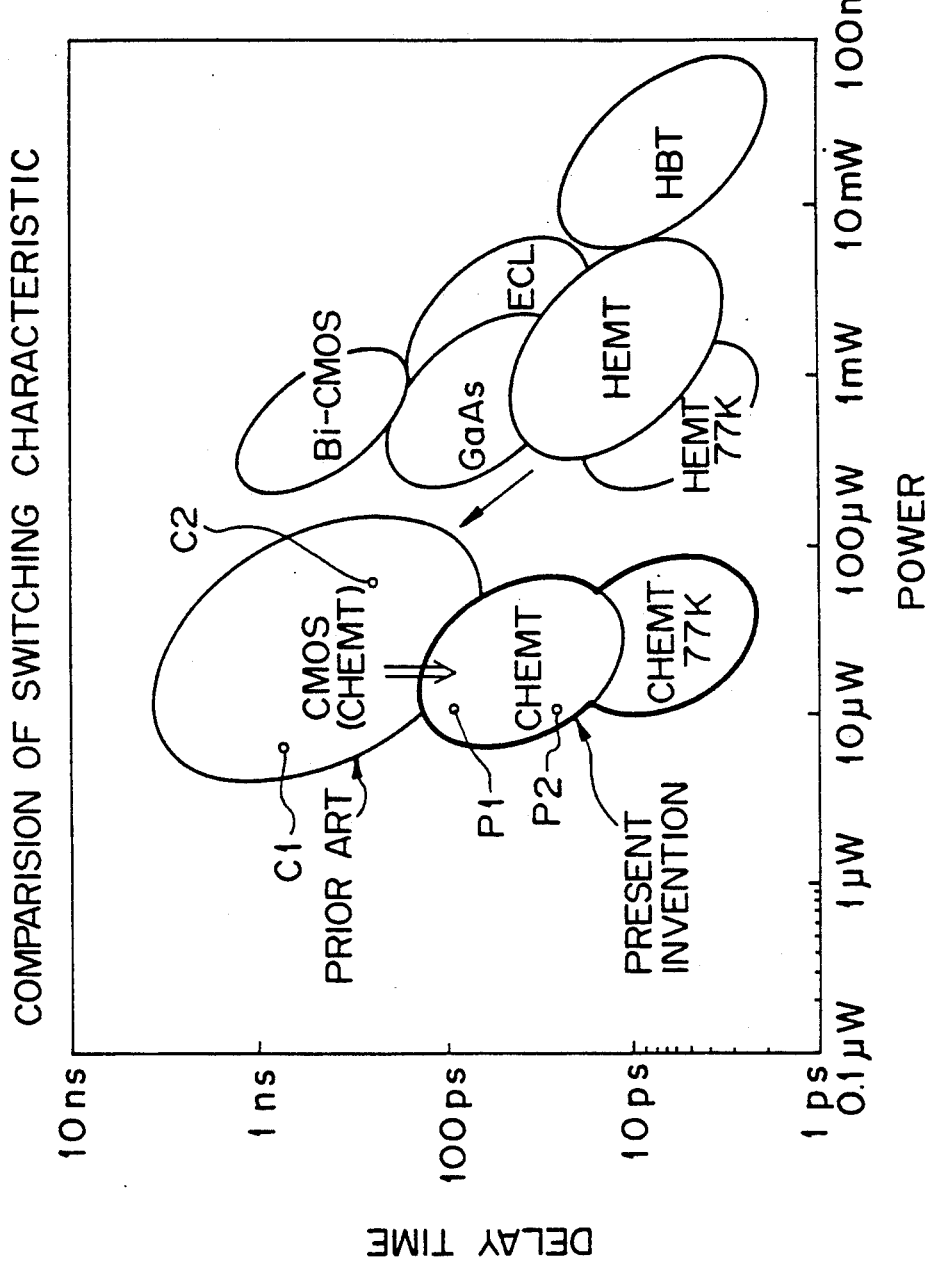
FIG. 7 is a graph showing switching properties of various semiconductor devices.

FIG. 7 shows switching properties of various semiconductor devices. In FIG. 7, the abscissa indicates a power and the ordinate indicates a delay time. For example, when a conventional C-HEMT having a gate length of about 1 μm is operated at a supply voltage of 1 V or 1.5 V, it has a performance indicated with a point C1 or C2, respectively. These performances are equivalent to those of C-MOS. The C-HEMT according to the present invention having a gate length of about 1.0 or 0.25 μm will operate at a supply voltage of 1 V, and it would have a performance indicated with a point P1 or P2, respectively. Thus, it is possible to obtain a C-HEMT having improved characteristics.

According to a second embodiment of the present invention, the above-mentioned semiconductor multilayer structure is utilized to provide a HEMT type semiconductor device serving as a multifunction element, shown in FIGS. 8A, 8B, 9A and 9B.

Figure 8A:
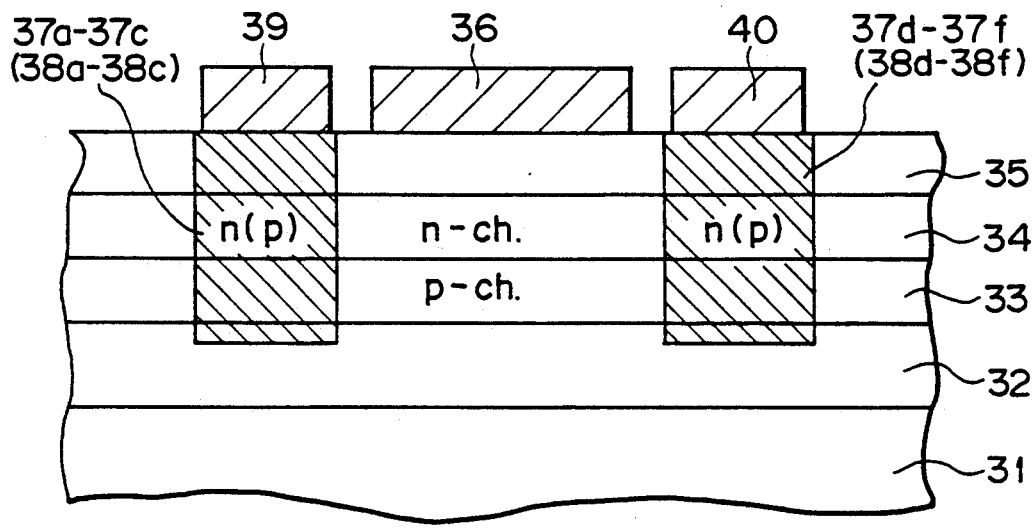
FIG. 8A is a schematic sectional view of a HEMT type semiconductor device according to another embodiment of the present invention.

As shown in FIG. 8A, the HEMT type semiconductor device comprises a semiconductor substrate 31 of, e.g., semi-insulating GaAs, a buffer layer 32 of, e.g, undoped Ge, a p-channel semiconductor well layer 33 of, e.g., undoped $In_{0.25}Ga_{0.75}As$, are n-channel semiconductor well layer 34, and a potential barrier layer 35 of, e.g., n-type $Al_{0.5}Ga_{0.5}As$; layer 32 to 35 being successively and epitaxially grown on the substrate 31 by an MOCVD method. Such a multilayer structure is similar to that shown in FIG. 4A of the Example 1. the n-type $Al_{0.5}Ga_{0.5}As$ layer 35 is doped with Si ions of about $1.4 \times 10^{18}$ $cm^{-3}$ and has a thickness of about 22 nm. It is possible to use the semiconductor multilayer structure shown in FIGS. 5, 6A and 6B, and to reverse the p-channel layer and the n-channel layer.

Figure 8B:
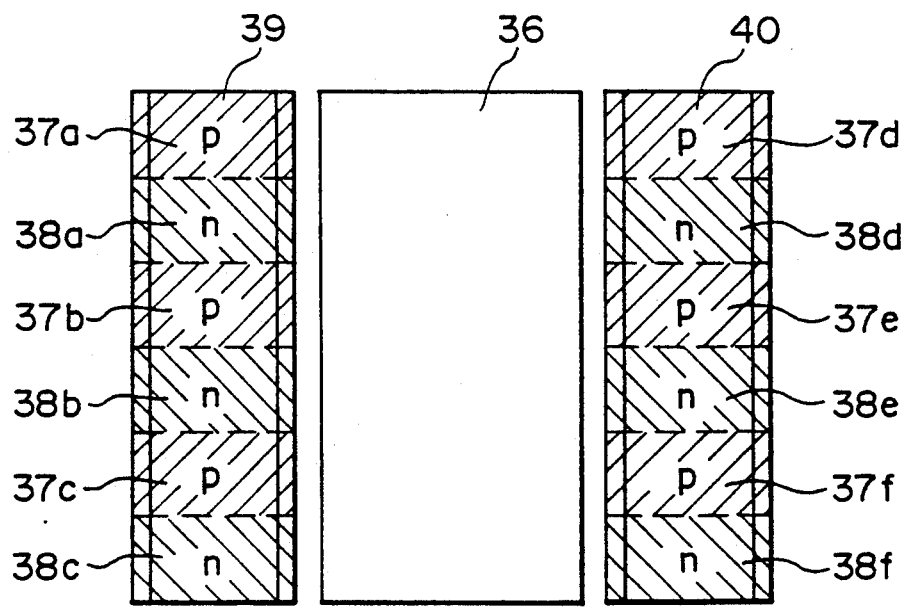
FIG. 8B is a schematic plan view of the device of FIG. 8A.

A Schottky gate electrode 36 of, e.g., WSi, is selectively formed on the potential barrier layer. Then, Be ions are selectively ion-implanted at an acceleration energy of about 40 keV and a dose of about $1.4 \times 10^{13}$ $cm^{-2}$ by using a suitable resist pattern as a mask, and Si ions are selectively ion-implanted at an acceleration energy of about 40 keV and a dose of about $1.4 \times 10^{13}$ $cm^{-2}$ by using another suitable resist pattern as a mask to form p-type regions 37a to 37f and n-type regions 38a to 38f, as shown in FIGS. 8A and 8B. Each of the doped regions extends to the buffer layer 32. The p-type regions 37a, 37b and 37c and the n-type regions 38a, 38b and 38c are alternately arranged to make a line on one side of the gate electrode 36, while the p-type regions 37d, 37e and 37f and the n-type regions 38d, 38e and 38f are alternately arranged to make a line on the other side of the gate electrode 36. Thereafter, a rapid thermal annealing is carried out.

Then, a metal (e.g., Au) layer is deposited and patterned by a vacuum evaporation method and a lift-off process to form ohmic electrodes 39 and 40 on the doped regions in the shape of two stripes.

Figure 9A:
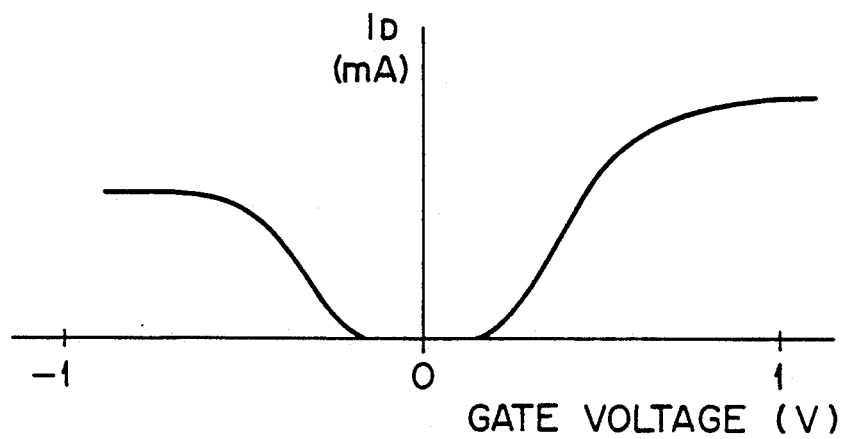
FIGS. 9A and 9B are diagrams showing a drain current versus a gate voltage, and an input signal and a corresponding output signal respectively, for the device of FIG. 8A.
Figure 9B:
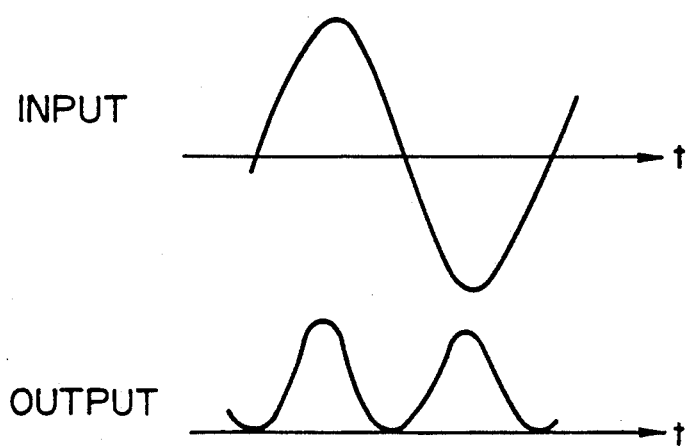
Figure 8A:
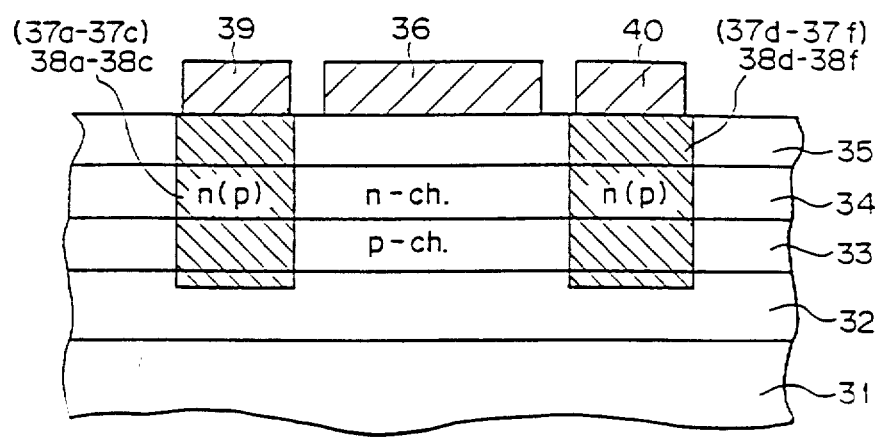
Figure 8B:
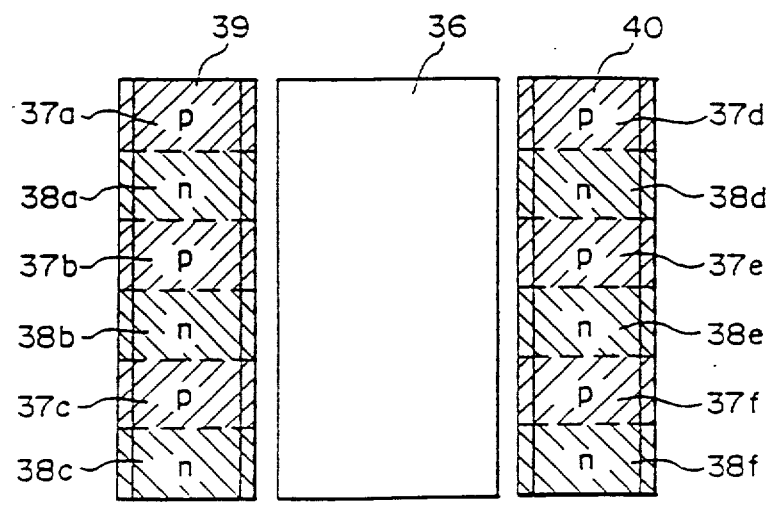

When the obtained HEMT type semiconductor device is controlled with a gate voltage applied on the Schottky gate electrode, the device operates as shown in FIGS. 9A and 9B. Namely, at a negative gate voltage the two dimensional hole gas is generated in a portion of the p-channel semiconductor well layer 33 and the p-channel HEMT operates, while at a positive gate voltage, the two dimensional electron gas is generated in a portion of the n-channel semiconductor well layer 34 and the n-channel HEMT operates as shown in FIG. 9A. In this case, FIG. 9A is obtained under conditions of about a 10 μm gate width and about a 1 μm gate length, and the threshold voltages of the p-channel and n-channel HEMTs are not reduced to zero. Therefore, an input of the gate voltage varies at an oscillation between a negative voltage and a positive voltage, with the result that an output of the drain current from the device varies, as shown in FIG. 9B. When the input (gate) voltage varies from positive to negative, the output current is obtained as a full-wave rectification state, whereby a double frequency generator can be constituted of only the obtained device (element) provided with one gate electrode and two ohmic electrodes.

It will be obvious that the present invention is not restricted to the above-mentioned embodiments and that many variations are possible for persons skilled in the art without departing from the scope of the invention.

I claim:

1. A HEMT type semiconductor device comprising:
   a semiconductor substrate;
   a buffer semiconductor layer formed on said semiconductor substrate; a first semiconductor well layer formed on said buffer semiconductor layer and serving as a first conductivity type channel layer, which is selected from one of a p-channel layer and an n-channel layer;
   a second semiconductor well layer formed directly on said first semiconductor well layer and serving as a second conductivity type opposite said first conductivity type, channel layer and which is the other of said p-channel layer and said n-channel layer, one of said first and second semiconductor well layers being formed of a material having a higher valence band top energy level and a higher conduction band bottom energy level than a material forming the other of said first and second semiconductor well layers; and a potential barrier layer formed on said second semiconductor well layer and forming a potential barrier for carriers, said n-channel layer having a conduction band bottom energy level lower than a conduction band bottom energy level of said semiconductor substrate.

2. A HEMT type semiconductor device according to claim 1, wherein said first semiconductor well layer is used for generating a two-dimensional hole gas of a p-channel, and said second semiconductor well layer is used for generating a two-dimensional electron gas of an n-channel.

3. A HEMT type semiconductor device according to claim 1, wherein said first semiconductor well layer is used for generating a two-dimensional electron gas of an n-channel, and said second semiconductor well layer is used for generating a two-dimensional hole gas of a p-channel.

4. A complementary HEMT type semiconductor device comprising:
a semiconductor substrate;
a buffer semiconductor layer formed on said semiconductor substrate;
a first semiconductor well layer formed on said buffer semiconductor layer and serving as a first conductivity type channel layer, which is selected from one of a p-channel layer and an n-channel layer;
a second semiconductor well layer formed directly on said first semiconductor well layer and serving as a second conductivity type opposite said first conductivity type, channel layer and which is the other of said p-channel layer and said n-channel layer, one of said first and second semiconductor well layers being formed of a material having a higher valence band top energy level and a higher conduction band bottom energy level than a material forming the other of said first and second semiconductor well layers;
a potential barrier layer formed on said second semiconductor well layer and forming a potential barrier for carriers;
an isolation region extending from said potential barrier layer to said semiconductor substrate for isolating a p-channel HEMT area and an n-type channel HEMT area.
p-type regions extending from said potential barrier layer to said buffer semiconductor layer within the p-channel HEMT area;
a first gate electrode formed on said potential barrier layer and located between said p-type regions;
n-type regions extending from said potential barrier layer to said buffer semiconductor layer within the n-channel HEMT area;
a threshold voltage controlling semiconductor layer selectively formed on said potential barrier layer between said n-type regions; and
a second gate electrode on said threshold voltage controlling layer,
said n-channel layer having a conduction band bottom energy level lower than a conduction band bottom energy level of said semiconductor substrate.

5. A semiconductor device according to claim 4, wherein said buffer semiconductor layer serves as a potential barrier for carriers flowing through said first conductivity type channel layer and other carriers flowing through said second conductivity type channel layer.

6. A semiconductor device according to claim 4, wherein said semiconductor substrate is GaAs, one of said first and second semiconductor well layers is one of Ge and GaAsSb, the other of said first and second semiconductor well layers is InGaAs, said potential barrier layer is one of AlGaAs and AlInGaP, and said threshold voltage controlling layer is GaAs.

7. A semiconductor device according to claim 4, wherein said semiconductor substrate is InP, one of said first and second semiconductor well layers is of GaAsSb, the other of said first and second semiconductor well layers is of InGaAs, said potential barrier layer is one of AlInAs, AlGaAs and AlGaAsSb, and said threshold voltage controlling layer is InP.

8. A HEMT type semiconductor device comprising:
a semiconductor substrate;
a buffer semiconductor layer formed on said semiconductor substrate;
a first semiconductor well layer formed on said buffer semiconductor layer and serving as a first conductivity type channel layer, which is selected from one of a p-channel layer and an n-channel layer;
a second semiconductor well layer formed directly on said first semiconductor well layer and serving as a second conductivity type opposite said first conductivity type, channel layer and which is the other of said p-channel layer and said n-channel layer, one of said first and second semiconductor well layers being formed of a material having a higher valence band top energy level and a higher conduction band bottom energy level than a material forming the other of said first and second semiconductor well layers;
a potential barrier layer formed on said second semiconductor well layer and forming a potential barrier for carriers;
a gate electrode formed on said potential barrier layer;
a pair of ohmic electrodes formed on said potential barrier layer and located on both sides of said gate electrode;
p-type regions extending from said potential barrier layer to said buffer semiconductor layer under said ohmic electrodes, respectively; and
n-type regions extending from said potential barrier layer to said buffer semiconductor layer under said ohmic electrodes, respectively, said p-type regions and n-type regions being adjacent to each other along a longitudinal direction of said ohmic electrodes,
said n-channel layer having a conduction band bottom energy level lower than a conduction band bottom energy level of said semiconductor substrate.

9. A semiconductor device according to claim 8, wherein said semiconductor substrate is GaAs, one of said first and second semiconductor well layers is one of Ge and GaAsSb, the other of said first and second semiconductor well layers is InGaAs, and said potential barrier layer is one of AlGaAs and AlInGaP.

10. A semiconductor device according to claim 8, wherein said semiconductor substrate is InP, one of said first and second semiconductor well layers is GaAsSb, the other of said first and second semiconductor well layers is InGaAs, and said potential barrier layer is one of AlInAs, AlGaAs and AlGaAsSb.

* * * * *

UNITED STATES PATENT AND TRADEMARK OFFICE
CERTIFICATE OF CORRECTION

PATENT NO. : 5,302,840
DATED : APRIL 12, 1994
INVENTOR(S) : Masahiko TAKIKAWA

It is certified that error appears in the above-indentified patent and that said Letters Patent is hereby corrected as shown below:

IN THE DRAWINGS — Sheet 9 of 10, FIG. 8A should be replaced with the new FIG. 8A, which was inadvertently omitted by the Patent Office.

Sheet 10 of 10, after this, new FIG. 10 should be added, which was inadvertently omitted by the Patent Office.

Col. 1, line 34, "$Ga_{0.5}$" should be --$GA_{0.75}$--;

line 35, "$Ga_{0.75}$" should be --$Ga_{0.5}$--.

Col. 7, line 7, "Si)" should be --(Si)--.

Signed and Sealed this

Fifteenth Day of November, 1994

Attest:

BRUCE LEHMAN

*Attesting Officer*     *Commissioner of Patents and Trademarks*